(12) United States Patent
Liu et al.

(10) Patent No.: US 11,791,413 B2
(45) Date of Patent: Oct. 17, 2023

(54) SEMICONDUCTOR DEVICE AND FABRICATION METHOD THEREOF

(71) Applicant: UNITED MICROELECTRONICS CORP., Hsin-Chu (TW)

(72) Inventors: Shi-You Liu, Kaohsiung (TW); Shih-Cheng Chen, Tainan (TW); Chia-Wei Chang, Tainan (TW); Chia-Ming Kuo, Kaohsiung (TW); Tsai-Yu Wen, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 249 days.

(21) Appl. No.: 17/392,222

(22) Filed: Aug. 2, 2021

(65) Prior Publication Data
US 2023/0014253 A1   Jan. 19, 2023

(30) Foreign Application Priority Data
Jul. 16, 2021   (CN) .......................... 202110804722.2

(51) Int. Cl.
*H01L 29/78*   (2006.01)
*H01L 29/66*   (2006.01)
*H01L 21/02*   (2006.01)
*H01L 29/08*   (2006.01)
*H01L 23/10*   (2006.01)

(52) U.S. Cl.
CPC .... *H01L 29/7851* (2013.01); *H01L 21/02126* (2013.01); *H01L 23/10* (2013.01); *H01L 29/0847* (2013.01); *H01L 29/6656* (2013.01); *H01L 29/66795* (2013.01)

(58) Field of Classification Search
CPC ......... H01L 21/02126; H01L 21/28141; H01L 21/823431; H01L 21/823821; H01L 21/845; H01L 23/10; H01L 27/0886; H01L 27/0924; H01L 27/1211; H01L 29/0653; H01L 29/0847; H01L 29/41791; H01L 29/6653; H01L 29/66553; H01L 29/6656; H01L 29/66795; H01L 29/785; H01L 29/7851; H01L 29/7853; H01L 29/7855; H01L 2029/7858
See application file for complete search history.

(56) References Cited

U.S. PATENT DOCUMENTS

| 7,479,431 | B2 | 1/2009 | Hattendorf | |
|---|---|---|---|---|
| 2004/0171201 | A1 | 9/2004 | Gambino | |
| 2016/0372567 | A1* | 12/2016 | Tak | H01L 29/7851 |
| 2019/0252239 | A1* | 8/2019 | Pal | H01L 27/0924 |
| 2020/0105620 | A1* | 4/2020 | Tan | H01L 21/02532 |
| 2020/0105938 | A1* | 4/2020 | Yang | H01L 29/66545 |
| 2021/0272966 | A1* | 9/2021 | Lin | H01L 21/28123 |
| 2021/0376105 | A1* | 12/2021 | Lin | H01L 29/7848 |

* cited by examiner

*Primary Examiner* — David C Spalla
(74) *Attorney, Agent, or Firm* — Winston Hsu

(57) ABSTRACT

A semiconductor device includes a fin protruding from a substrate and extending in a first direction, a gate structure extending on the fin in a second direction, and a seal layer located on the sidewall of the gate structure. A first peak carbon concentration is disposed in the seal layer. A first spacer layer is located on the seal layer. A second peak carbon concentration is disposed in the first spacer layer. A second spacer layer is located on the first spacer layer.

18 Claims, 3 Drawing Sheets

SEMICONDUCTOR DEVICE AND FABRICATION METHOD THEREOF

BACKGROUND OF THE INVENTION

1. Field of the Invention

The present invention relates to the field of semiconductor technology, in particular to a fin field effect transistor (FinFET) semiconductor device and a fabrication method thereof.

2. Description of the Prior Art

Fin field effect transistors (FinFETs) are non-planar, multi-gate transistors having "fins" that perpendicularly extend from the gate and form the source and the drain of the transistor. Multiple FinFETs may be coupled to one another to provide an integrated circuit device. A conductive layer may be formed over the fins to provide a local interconnect between adjacent FinFETs.

The use of local interconnects enables a higher packing density and reduced $R_{SD}$. However, the formation of the slot contact of the local interconnects increases the parasitic fringe capacitance ($C_{of}$), which significantly degrades the circuit speed. Therefore, there is a need in this industry to provide an improved semiconductor device that is able to suppress capacitive coupling between the gate and the slot contact.

SUMMARY OF THE INVENTION

It is one object of the present invention to provide an improved semiconductor device and a method for fabricating the same in order to overcome the above-mentioned prior art shortcomings or deficiencies.

One aspect of the invention provides a semiconductor device including a fin protruding from a substrate and extending along a first direction, a gate structure extending along a second direction on the fin, a seal layer on a sidewall of the gate structure, a first peak carbon concentration in the seal layer, a first spacer layer on the seal layer, a second peak carbon concentration in the first spacer layer, and a second spacer layer on the first spacer layer.

According to some embodiments, the seal layer comprises SiOCN and has a thickness of about 40 angstroms, and wherein the first spacer layer comprises SiOCN and has a thickness of about 70 angstroms.

According to some embodiments, the first peak carbon concentration is located about 80-84 angstroms below an interface between the first spacer layer and the second spacer layer.

According to some embodiments, the second spacer layer is a silicon-rich silicon nitride layer and has a thickness of about 55 angstroms.

According to some embodiments, the second peak carbon concentration is located about 80-84 angstroms below a top surface of the second spacer layer.

According to some embodiments, the gate structure comprises a gate dielectric layer and a metal gate on the gate dielectric layer.

According to some embodiments, the semiconductor device further includes a source/drain region adjacent to the second spacer layer.

According to some embodiments, the semiconductor device further includes an epitaxial layer in the source/drain region.

According to some embodiments, the epitaxial layer includes SiP, SiC or SiGe.

According to some embodiments, the seal layer has a dielectric constant that is less than 4.

Another aspect of the invention provides a method of forming a semiconductor device. A fin protruding from a substrate and extending along a first direction is provided. A gate structure extending along a second direction is formed on the fin. A seal layer is formed on a sidewall of the gate structure. A first spacer layer is formed on the seal layer. A first carbon implantation process is then performed to implant carbon into the seal layer such that a first peak carbon concentration is disposed in the seal layer. A second spacer layer is then formed on the first spacer layer. A second carbon implantation process is then performed to implant carbon into the first spacer layer such that a second peak carbon concentration is disposed in the first spacer layer.

According to some embodiments, the seal layer comprises SiOCN and has a thickness of about 40 angstroms, and wherein the first spacer layer comprises SiOCN and has a thickness of about 70 angstroms.

According to some embodiments, the first peak carbon concentration is located about 80-84 angstroms below an interface between the first spacer layer and the second spacer layer.

According to some embodiments, the second spacer layer is a silicon-rich silicon nitride layer and has a thickness of about 55 angstroms.

According to some embodiments, the second peak carbon concentration is located about 80-84 angstroms below a top surface of the second spacer layer.

According to some embodiments, the first carbon implantation process and the second carbon implantation process are performed at a tilt-angle of about 30 degrees with an implant energy of about 2KeV and an implant dose of about 5E15 atoms/cm$^2$.

According to some embodiments, a source/drain region is formed adjacent to the second spacer layer.

According to some embodiments, an epitaxial layer is formed in the source/drain region.

According to some embodiments, the epitaxial layer comprises SiP, SiC or SiGe.

According to some embodiments, the seal layer has a dielectric constant that is less than 4.

One advantage of the present invention is that a first peak carbon concentration is disposed in the sealing layer and a second peak carbon concentration is disposed in the first spacer layer, so that the dielectric constant of the sealing layer and the first spacer layer can be significantly reduced, thereby reducing the parasitic fringe capacitance (Cof).

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
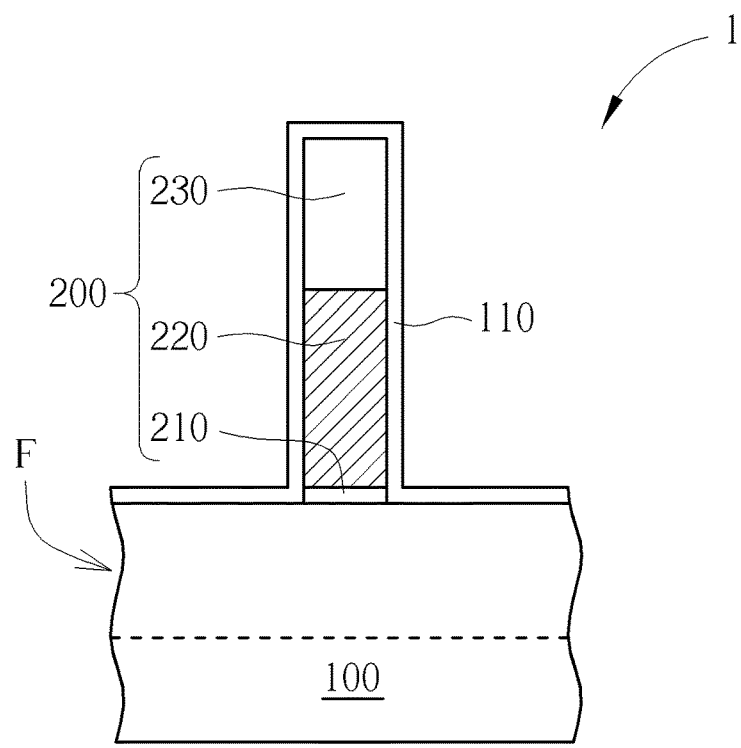
FIG. 1 to FIG. 6 are schematic diagrams showing an exemplary method of forming a semiconductor device according to an embodiment of the present invention.

Please refer to FIG. 1 to FIG. 6, which are schematic diagrams showing an exemplary of forming a semiconductor device 1 according to an embodiment of the present invention. As shown in FIG. 1, a substrate 100, such as a silicon substrate or other suitable semiconductor substrates, is provided. A fin F protruding from the substrate 100 and extending in a first direction is formed. A gate structure 200 extending in a second direction is then formed on the fin F. The first direction may be orthogonal to the second direction. Since the formation of the fin F and the gate structure 200 on the substrate 100 is a well-known technique, the details thereof will be omitted for the sake of simplicity.

According to an embodiment of the present invention, the gate structure 200 may include a gate dielectric layer 210, a conductive layer 220, and a hard mask layer 230, but is not limited thereto. For example, the gate dielectric layer 210 may be a silicon oxide layer, the conductive layer 220 may be a polysilicon layer, and the hard mask layer 230 may be a silicon nitride layer.

Next, a sealing layer 110 is formed on the gate structure 200 and the fin F. According to an embodiment of the present invention, the sealing layer 110 includes SiOCN and has a thickness ranging from 35 to 45 angstroms, for example, 40 angstroms. According to an embodiment of the present invention, the dielectric constant of the sealing layer 110 is less than 4.

According to an embodiment of the present invention, the sealing layer 110 may be formed by a method such as chemical vapor deposition (CVD) or atomic layer deposition (ALD). According to an embodiment of the present invention, the sealing layer 110 is conformally deposited on the sidewall of the gate structure 200 and on the surface of the fin F.

Figure 2:
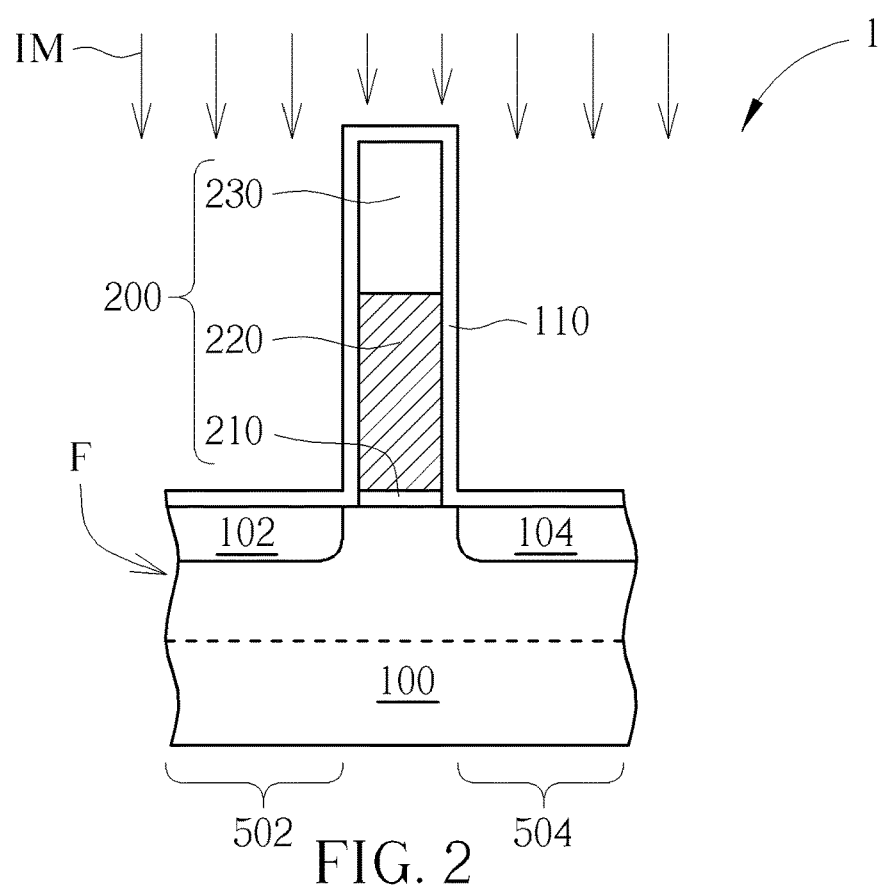

As shown in FIG. 2, next, an ion implantation process IM is performed to implant N-type or P-type dopants into the fin F to form lightly doped drain (LDD) regions 102 and 104. On both sides of the gate structure 200 are source/drain regions 502 and 504.

Figure 3:
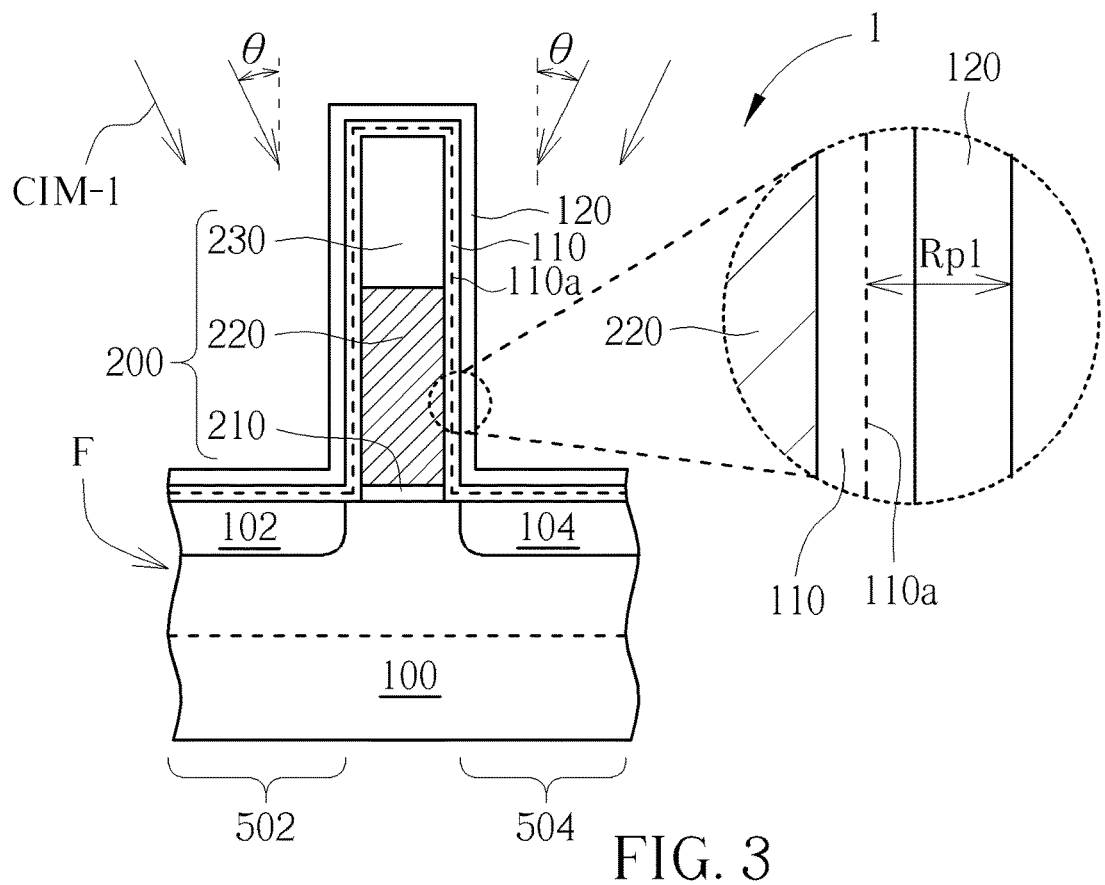

As shown in FIG. 3, the first spacer layer 120 is then formed on the sealing layer 110. According to an embodiment of the present invention, the first spacer layer 120 comprises SiOCN. According to an embodiment of the present invention, the thickness of the first spacer layer 120 is between 65 and 75 angstroms, for example, 70 angstroms. The first spacer layer 120 may be formed by a method such as chemical vapor deposition or atomic layer deposition.

After the first spacer layer 120 is deposited, a first carbon implantation process CIM-1 is performed to implant carbon into the sealing layer 110 so that the sealing layer 110 has a first peak carbon concentration 110a. According to an embodiment of the present invention, the first carbon implantation process CIM-1 is performed with a tilt angle θ of 30 degrees, an implantation energy of 2 KeV, and an implantation dose of 5E15 atoms/cm². Under the above conditions, the carbon implant projected range $R_{P1}$ is 80-84 angstroms, for example, 82 angstroms.

According to an embodiment of the present invention, as shown in the enlarged schematic diagram in the circle region in FIG. 3, the first peak carbon concentration 110a is located at 80 angstroms to 84 angstroms below the surface of the first spacer layer 120, for example, 82 angstroms.

Figure 4:
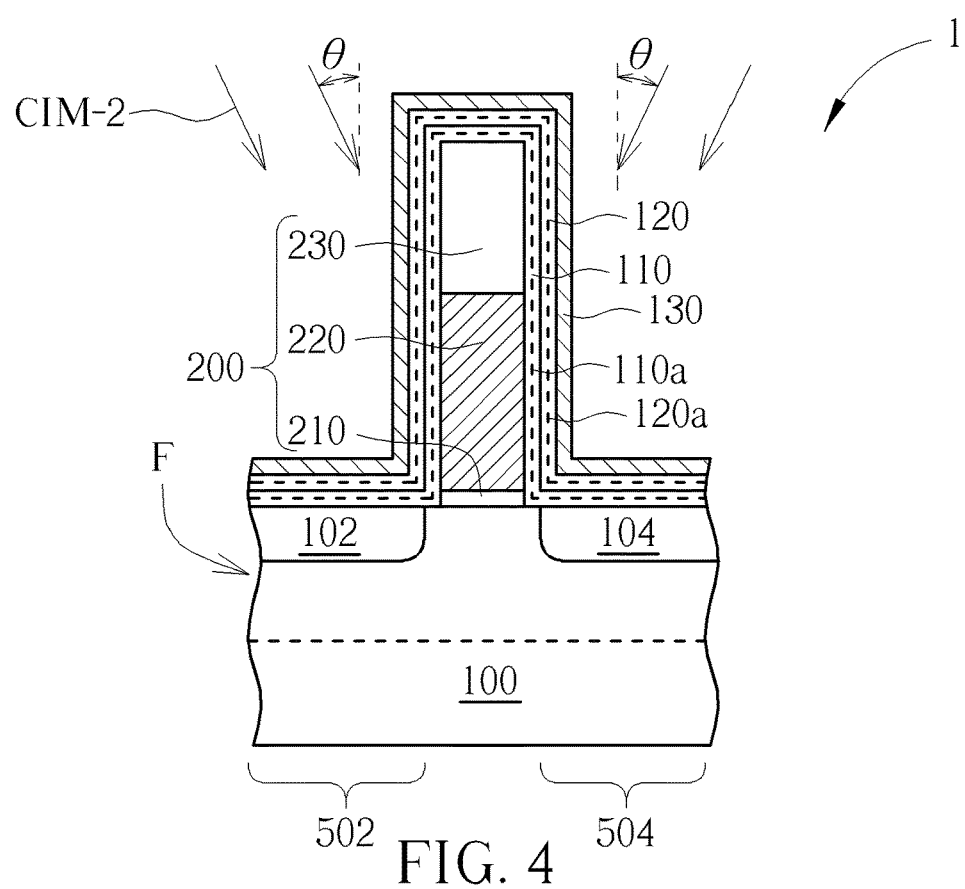

As shown in FIG. 4, next, a second spacer layer 130 is formed on the first spacer layer 120. According to an embodiment of the present invention, the second spacer layer 130 is a silicon-rich silicon nitride layer. According to an embodiment of the present invention, the thickness of the second spacer layer 130 is about 55 angstroms. The second spacer layer 130 may be formed by a method such as chemical vapor deposition or atomic layer deposition.

After the second spacer layer 130 is deposited, the second carbon implantation process CIM-2 is performed to implant carbon into the first spacer layer 120 and the second spacer layer 130, so that the first spacer layer 120 has a second peak carbon concentration 120a. According to an embodiment of the present invention, the second carbon implantation process CIM-2 is performed with a tilt angle θ of 30 degrees, an implantation energy of 2 KeV, and an implantation dose of 5E15 atoms/cm². Under the above conditions, the carbon implantation projection range $R_{P2}$ is 80-84 angstroms, for example, 82 angstroms.

Figure 5:
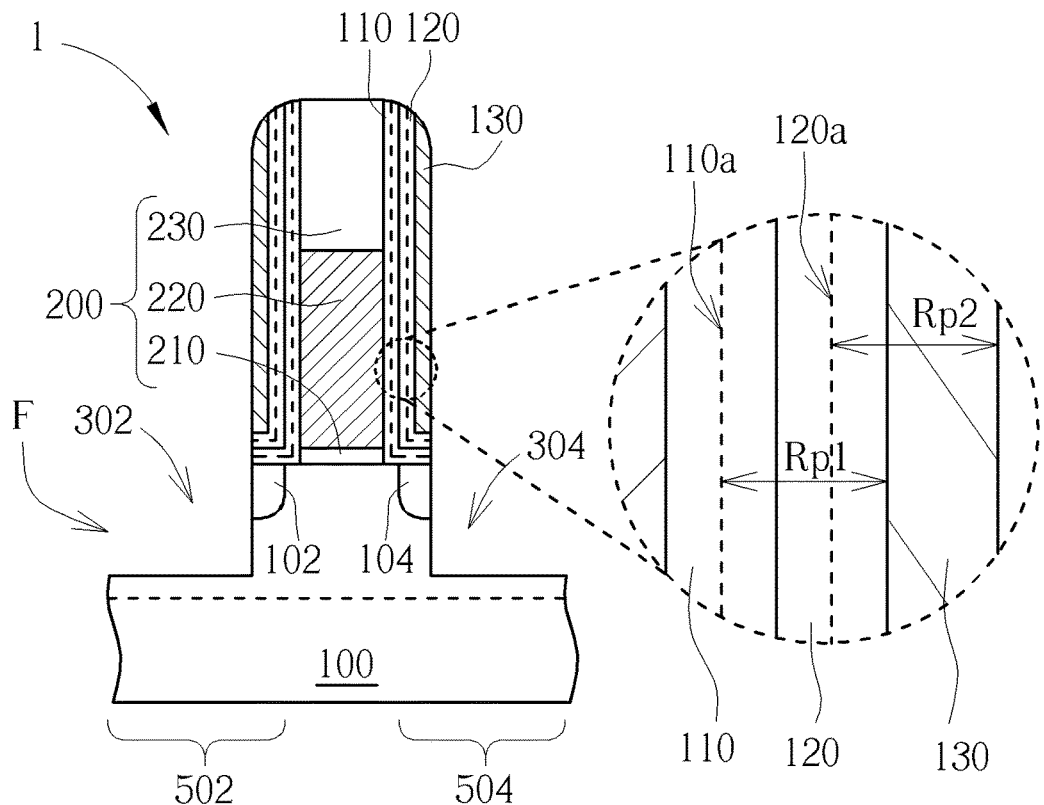

Next, as shown in FIG. 5, an anisotropic dry etching process is performed to etch the second spacer layer 130, the first spacer layer 120 and the sealing layer 110. Recessed regions 302 and 304 are formed in the fin F within the source/drain regions 502 and 504, respectively, on both sides of the gate structure 200.

According to an embodiment of the present invention, as shown in the enlarged schematic diagram shown in the circle in FIG. 5, the second peak carbon concentration 120a is located 80-84 angstroms below the top surface of the second spacer layer 130, for example, 82 angstroms. The first peak carbon concentration 110a is located 80 to 84 angstroms below an interface between the first spacer layer 120 and the second spacer layer 130.

Figure 6:
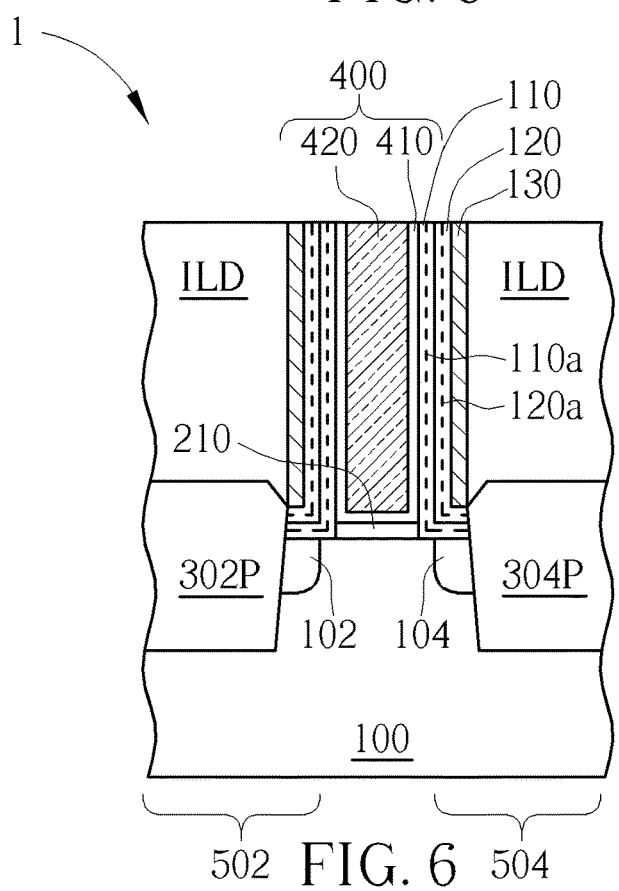

As shown in FIG. 6, an epitaxial process is then performed to grow epitaxial layers 302P and 304P from the recessed regions 302 and 304 within the source/drain regions 502 and 504 on both sides of the gate structure 200. According to an embodiment of the present invention, the epitaxial layers 302P and 304P may include SiP, SiC, or SiGe, but are not limited thereto. Next, a dielectric layer ILD is deposited, and a replacement metal gate (RMG) process is performed to form a gate structure 400.

According to an embodiment of the present invention, the gate structure 400 includes a gate dielectric layer 410 and a metal gate 420 located on the gate dielectric layer 410. The gate dielectric layer 410 may be any suitable high dielectric constant material. The metal gate 420 may include titanium, titanium nitride, copper, tungsten, aluminum, alloys thereof, or any combination thereof.

One advantage of the present invention is that the sealing layer 110 has a first peak carbon concentration 110a and the first spacer layer 120 has a second peak carbon concentration 120a, so that the dielectric constant (k) of the sealing layer 110 and the first spacer layer 120, both of which are composed of SiOCN, can be significantly reduced, thereby reducing the parasitic fringe capacitance ($C_{of}$).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a fin protruding from a substrate and extending along a first direction;
a gate structure extending along a second direction on the fin;
a seal layer on a sidewall of the gate structure, wherein the seal layer comprises SiOCN and has a thickness of about 40 angstroms;
a first peak carbon concentration in the seal layer;
a first spacer layer on the seal layer, wherein the first spacer layer comprises SiOCN and has a thickness of about 70 angstroms;
a second peak carbon concentration in the first spacer layer; and
a second spacer layer on the first spacer layer, wherein the first peak carbon concentration is located about 80-84 angstroms below an interface between the first spacer layer and the second spacer layer.

2. The semiconductor device according to claim 1, wherein the second spacer layer is a silicon-rich silicon nitride layer and has a thickness of about 55 angstroms.

3. The semiconductor device according to claim 2, wherein the second peak carbon concentration is located about 80-84 angstroms below a top surface of the second spacer layer.

4. The semiconductor device according to claim 1, wherein the gate structure comprises a gate dielectric layer and a metal gate on the gate dielectric layer.

5. The semiconductor device according to claim 1 further comprising a source/drain region adjacent to the second spacer layer.

6. The semiconductor device according to claim 5 further comprising an epitaxial layer in the source/drain region.

7. The semiconductor device according to claim 6, wherein the epitaxial layer comprises SiP, SiC or SiGe.

8. The semiconductor device according to claim 1, wherein the seal layer has a dielectric constant that is less than 4.

9. A method of forming a semiconductor device, comprising:
forming a fin protruding from a substrate and extending along a first direction;
forming a gate structure extending along a second direction on the fin;
forming a seal layer on a sidewall of the gate structure;
forming a first spacer layer on the seal layer;
performing a first carbon implantation process to implant carbon into the seal layer such that a first peak carbon concentration is disposed in the seal layer;
forming a second spacer layer on the first spacer layer; and
performing a second carbon implantation process to implant carbon into the first spacer layer such that a second peak carbon concentration is disposed in the first spacer layer.

10. The method according to claim 9, wherein the seal layer comprises SiOCN and has a thickness of about 40 angstroms, and wherein the first spacer layer comprises SiOCN and has a thickness of about 70 angstroms.

11. The method according to claim 10, wherein the first peak carbon concentration is located about 80-84 angstroms below an interface between the first spacer layer and the second spacer layer.

12. The method according to claim 10, wherein the second spacer layer is a silicon-rich silicon nitride layer and has a thickness of about 55 angstroms.

13. The method according to claim 12, wherein the second peak carbon concentration is located about 80-84 angstroms below a top surface of the second spacer layer.

14. The method according to claim 9, wherein the first carbon implantation process and the second carbon implantation process are performed at a tilt-angle of about 30 degrees with an implant energy of about 2KeV and an implant dose of about 5E15 atoms/cm$^2$.

15. The method according to claim 9 further comprising:
forming a source/drain region adjacent to the second spacer layer.

16. The method according to claim 15 further comprising:
forming an epitaxial layer in the source/drain region.

17. The method according to claim 16, wherein the epitaxial layer comprises SiP, SiC or SiGe.

18. The method according to claim 9, wherein the seal layer has a dielectric constant that is less than 4.

* * * * *